United States Patent
Behfar et al.

(10) Patent No.: US 7,012,291 B2
(45) Date of Patent: Mar. 14, 2006

(54) MONOLITHIC THREE-DIMENSIONAL STRUCTURES

(75) Inventors: Alex Behfar, Ithaca, NY (US); Alfred T. Schremer, Ithaca, NY (US); Cristian B. Stagarescu, Ithaca, NY (US)

(73) Assignee: BinOptics Corporation, Ithaca, NY (US)

( * ) Notice: Subject to any disclaimer, the term of this patent is extended or adjusted under 35 U.S.C. 154(b) by 18 days.

(21) Appl. No.: 10/620,348

(22) Filed: Jul. 17, 2003

(65) Prior Publication Data

US 2004/0028327 A1   Feb. 12, 2004

Related U.S. Application Data

(62) Division of application No. 09/953,123, filed on Sep. 19, 2001, now Pat. No. 6,653,244.

(51) Int. Cl.
   *H01L 31/062*   (2006.01)
   *H01L 21/302*   (2006.01)

(52) U.S. Cl. ............... 257/290; 257/414; 257/432; 438/736; 438/737

(58) Field of Classification Search ............... 257/40, 257/290, 414, 431, 432, 643; 438/780, 736, 438/737
See application file for complete search history.

(56) References Cited

U.S. PATENT DOCUMENTS

| | | | |
|---|---|---|---|
| 4,114,257 A | 9/1978 | Bellavance | |
| 4,124,270 A | 11/1978 | Cheo | |
| 4,851,368 A | 7/1989 | Behfar-Rad et al. | |
| 4,924,476 A | 5/1990 | Behfar-Rad | |
| 4,985,374 A | 1/1991 | Tsuji et al. | |
| 5,030,583 A | 7/1991 | Beetz, Jr. | |
| 5,132,983 A | 7/1992 | Behfar-Rad | |
| 5,239,600 A | 8/1993 | Handa et al. | |
| 5,275,695 A * | 1/1994 | Chang et al. | 216/27 |
| 5,717,251 A | 2/1998 | Hayashi et al. | |
| 5,741,624 A | 4/1998 | Jeng et al. | |
| 5,764,681 A | 6/1998 | Ballantyne et al. | |
| 5,824,581 A | 10/1998 | Tseng | |
| 5,981,367 A | 11/1999 | Gonzalez | |
| 6,252,725 B1 * | 6/2001 | Tran et al. | 359/811 |

(Continued)

OTHER PUBLICATIONS

Behafar-Rad, a.; Ballantyne, J.M.; Wong, S.S., "AlGaAs/GaAs-based triangular-shaped ring ridge lasers," Applied Physics Letter, American Institute of Physics, vol. 60 (No. 14), p. 1658-1660. (Apr. 6, 1992).

(Continued)

*Primary Examiner*—Hsien-ming Lee
(74) *Attorney, Agent, or Firm*—Jones, Tullar & Cooper, PC

(57) ABSTRACT

Three-dimensional structures of arbitrary shape are fabricated on the surface of a substrate through a series of processing steps wherein a monolithic structure is fabricated in successive layers. A first layer of photoresist material is spun onto a substrate surface and is exposed in a desired pattern corresponding to the shape of a final structure, at a corresponding cross-sectional level in the structure. The layer is not developed after exposure; instead, a second layer of photoresist material is deposited and is also exposed in a desired pattern. Subsequent layers are spun onto the top surface of prior layers and exposed, and upon completion of the succession of layers each defining corresponding levels of the desired structure, the layers are all developed at the same time leaving the three-dimensional structure.

21 Claims, 5 Drawing Sheets

U.S. PATENT DOCUMENTS

| | | | |
|---|---|---|---|
| 6,343,171 B1 * | 1/2002 | Yoshimura et al. | 385/50 |
| 6,381,013 B1 * | 4/2002 | Richardson | 356/305 |
| 6,384,971 B1 | 5/2002 | Faris | |
| 6,452,110 B1 * | 9/2002 | Clevenger et al. | 174/257 |
| 6,465,157 B1 | 10/2002 | Li et al. | |
| 2001/0016247 A1 * | 8/2001 | Matsuura et al. | 428/188 |

OTHER PUBLICATIONS

Behfar-Rad, A.; Wong, S.S., "Monolithic AlGaAs-GaAs Single Quantum-Well Ridge Lasers Fabricated with Dry-Etched Facets and Ridges," Journal of Quantum Electronics, IEEE, vol. 28 (No. 5), p. 1227-1231, (May 23, 1992).

* cited by examiner

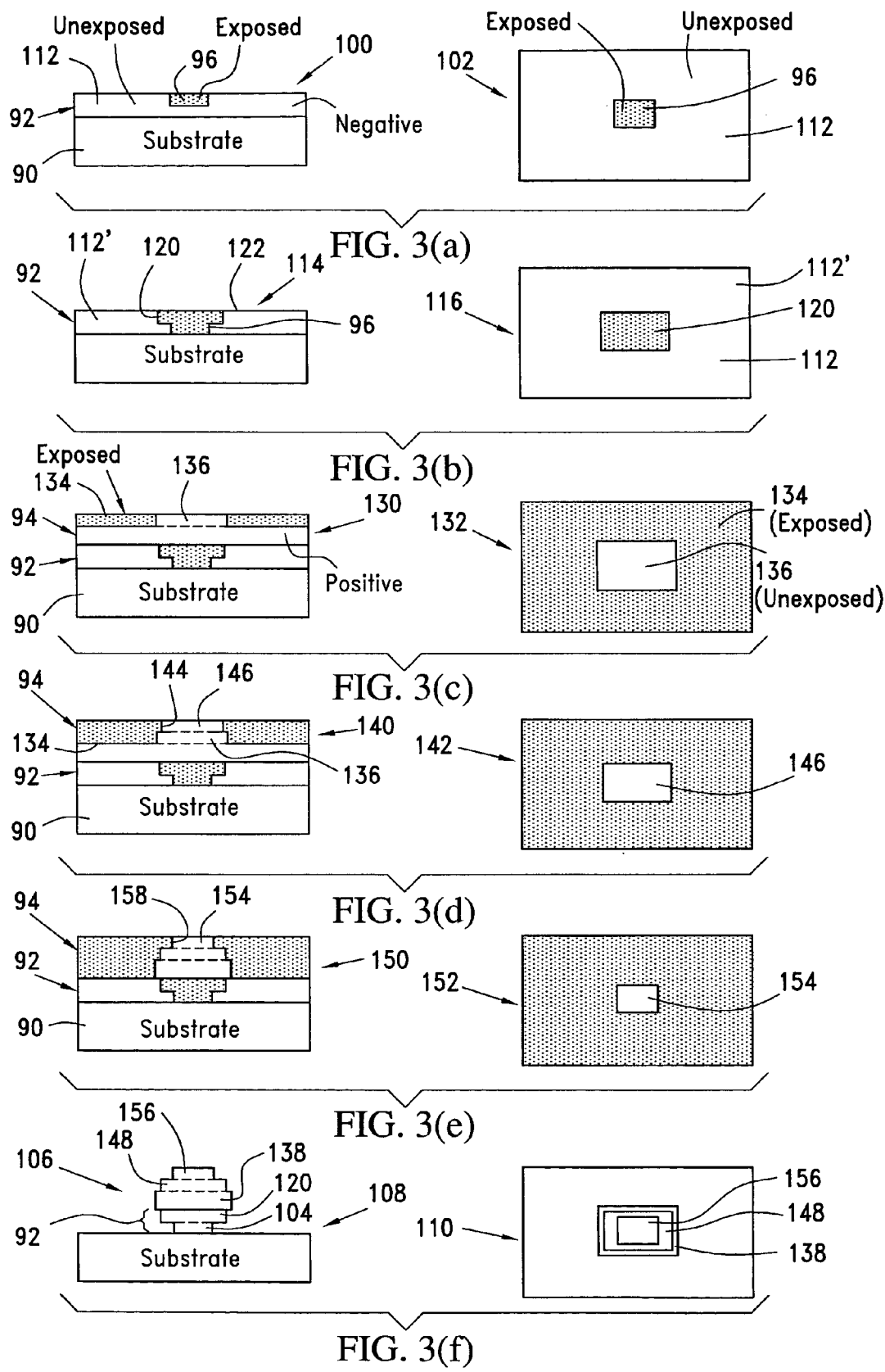

MONOLITHIC THREE-DIMENSIONAL STRUCTURES

This application is a division of U.S. application Ser. No. 09/953,123, filed Sep. 19, 2001, and entitled "Monolithic Three-Dimensional Structures", the disclosure of which is hereby incorporated herein by reference.

BACKGROUND OF THE INVENTION

The present invention relates, in general, to methods for fabricating monolithic three-dimensional structures on a substrate, and more particularly to methods for fabricating optical couplers for integrated laser and waveguide structures.

Advances in the technology available for processing and fabricating semiconductor devices have allowed structures of various shapes to be formed on the surface of a wafer, as by the use of a variety of photosensitive materials applied to the surface of the substrate and various photolithographic processes for defining structures to be fabricated. For example, conventional photoresist materials can be spun onto a substrate surface and then exposed to light in specified regions, as through the use of photolithographic masks, to create patterns on the substrate after the photoresist has been developed. Such techniques may be used, for example, to fabricate integrated lasers and waveguides, including ring lasers with a variety of cavity configurations such as those described in U.S. Pat. No. 5,132,983 and in copending U.S. patent application Ser. No. 09/918,544, filed Aug. 1, 2001, the disclosures of which are hereby incorporated herein by reference. The development of these technologies and the capability of producing a wide range of laser and waveguide structures expands the prospective applications for integrated optical devices, and adds the attractiveness of greater manufacturability and reduced cost.

Optical couplers are conventionally used to couple light to and from integrated optical laser and waveguide devices; however, easy and efficient techniques for coupling such devices with external components such as optical fibers are not available. Although optical couplers of various designs have been developed, there is great difficulty in aligning such couplers with integrated optical devices and with external optical components such as optical fibers, and the resulting low yield produces high costs for such devices. Accordingly, a monolithic optical coupler having an arbitrary three-dimensional pattern would be very desirable, for it would enable cost effective, high yield fabrication of integrated optical components and their couplers to enable coupling of the devices with external components such as optical fibers.

SUMMARY OF THE INVENTION

In accordance with the present invention, three-dimensional structures of arbitrary shape are fabricated on the surface of a substrate through a series of processing steps which form a monolithic structure by fabricating it in successive layers. These layers preferably are formed from a lithographically definable material such as conducting polymers, resist materials, or the like. For convenience, the following description will refer to layers formed of photoresist materials, but it will be understood that such other materials can also be used. Thus, for example, in accordance with a preferred form of the invention, a first layer of a photoresist material is spun onto a substrate surface and is exposed to a desired pattern corresponding to the shape of the final structure at a corresponding level in the structure. The first layer is not developed after exposure; instead a second layer of photoresist material is deposited on top of the first layer and is also exposed to a pattern at least partially vertically aligned with the first pattern. Subsequent layers are spun onto the top surfaces of prior layers and additional aligned patterns are exposed. If desired, a barrier layer may be provided between successive layers to prevent intermixing. Upon completion of the successive vertically aligned layers defining the structures, the layers are all developed at the same time. This removes the exposed material (in the case of a positive photoresist) leaving the unexposed material behind to form a three-dimensional structure having levels corresponding to the exposed patterns. In the case of a negative photoresist material, the exposed material forms the structure.

The foregoing process utilizes either a positive or negative photoresist material, but in a modification of the process, the three-dimensional structure can be fabricated using some positive photosensitive materials and some negative photosensitive materials. The exposure of the photoresist materials preferably is done photolithographically, allowing a wide range of shapes and configurations. It will be understood, however, that e-beam, x-ray or other forms of radiation may be used to expose corresponding resist or other lithographically definable layers using the same layering technique disclosed herein.

The fabrication techniques of the invention may be used to produce optical couplers, gratings, and other multilayer devices of arbitrary shape for use with optical systems, in integrated circuit systems, and the like, where multilayered structures are needed.

BRIEF DESCRIPTION OF THE DRAWINGS

The foregoing, and additional objects, features and advantages of the present invention will be apparent to those of skill in the art from the following detailed description of preferred embodiments thereof, taken in conjunction with the accompanying drawings, in which:

FIGS. 3(*a*) through 3(*f*) illustrate the process steps for forming a monolithic three-dimensional structure in accordance with a second embodiment of the invention;

DESCRIPTION OF PREFERRED EMBODIMENTS

Figure 1A:
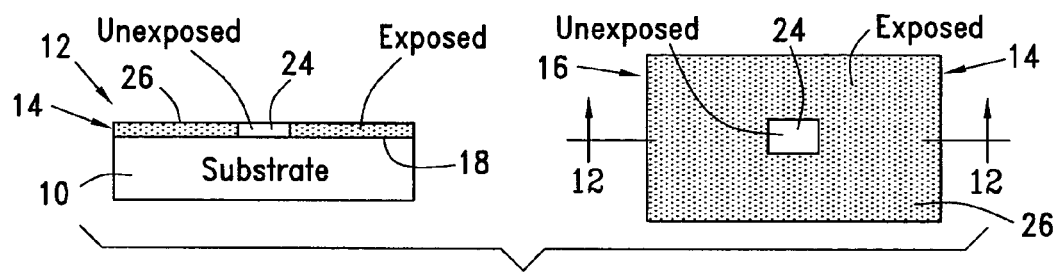
FIGS. 1(*a*) through 1(*f*) illustrate the process steps used in the formation of a monolithic three-dimensional structure in accordance with a first embodiment of the present invention.
Figure 1B:
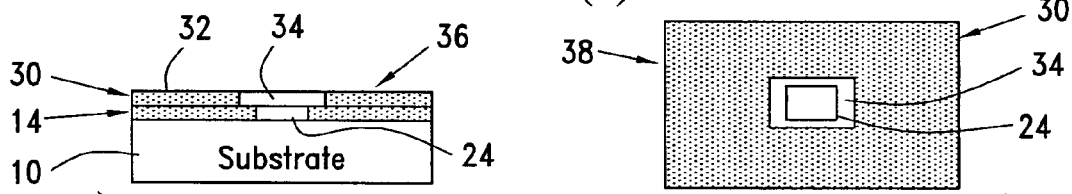
Figure 1C:
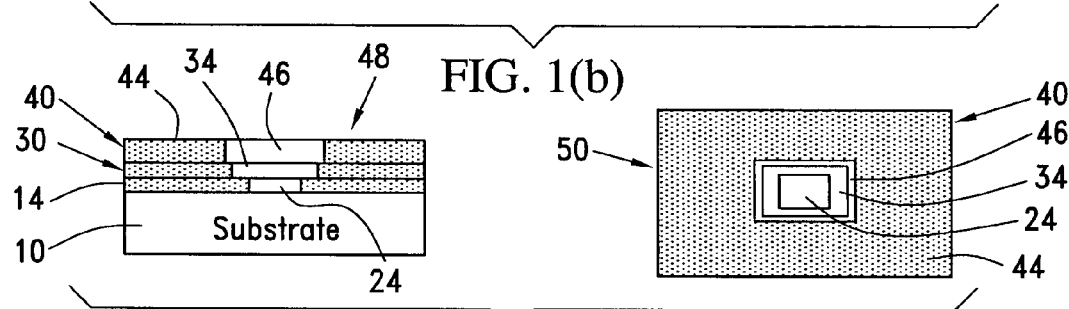
Figure 1D:
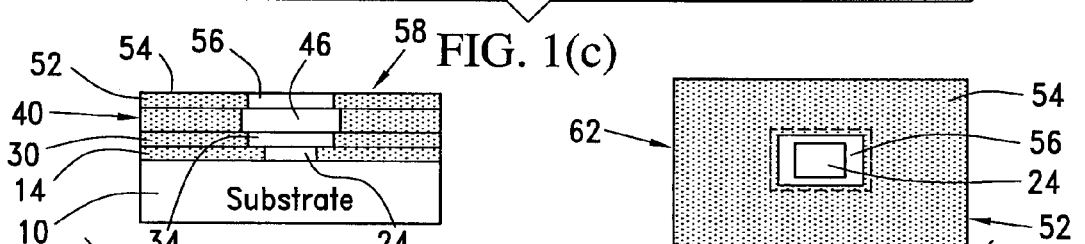
Figure 1E:
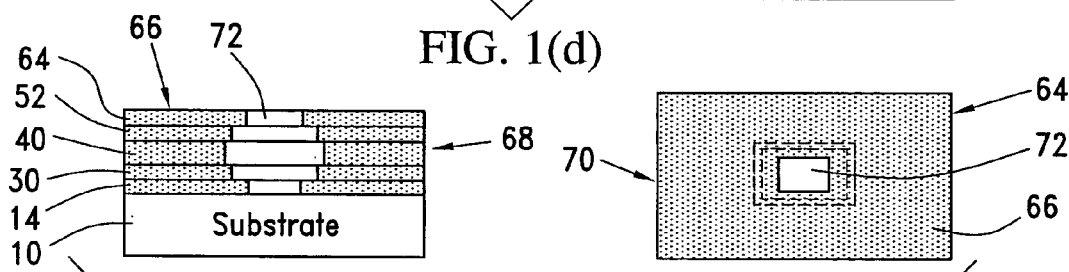

Turning now to a more detailed description of the present invention, FIGS. 1(*a*)–1(*f*) illustrate a series of processing steps which are used to form a monolithic structure in accordance with the present invention. As will be described in greater detail, a solid three-dimensional structure of an arbitrary shape is formed on the surface of a substrate by fabricating a series of successive layers, which may be of different thickness, and processing each layer in turn. These layers correspond to cross sectional levels in the desired arbitrary three-dimensional structure so that the entire thickness of the structure is built up through the use of successively exposed layers of photosensitive material. These successive layers are illustrated in FIGS. 1(a)–1(e), to which reference is now made. In accordance with the process of the invention, a substrate 10, illustrated in cross-sectional view 12, carries a first layer 14 of a conventional resist material, as illustrated in top plan view at 16. This top layer 14 may, for example, be a photoresist layer that has been spun on the top surface 18 of the substrate, and may be of any desired thickness. This thickness corresponds to the desired height of a first level 20 of a three-dimensional structure 22 to be formed on the surface of the substrate, an example of such a structure being illustrated in FIG. 1(f) and in FIG. 2. Conventional photolithographic tools, such as a projection aligner, are used to expose the layer 14 of the photoresist film through a pattern in the desired regions of the film, in accordance with the arbitrary shape of the structure to be fabricated. In the illustrated embodiment, such a pattern includes a first portion 24 of the resist layer 14 which is masked so that it remains unexposed, with the remaining portion 26 of layer 14 being exposed to a suitable source of light, in known manner. The unexposed portion 24 corresponds in shape and thickness to the first level 20 of the structure 22.

Unlike conventional lithography, the resist layer 14 is not developed after the exposure; instead, a second layer 30, which also may be a conventional photoresist material, is spun onto the top surface of the first layer 14. Depending on the type of the lithographically-definable material used for the second layer 30, there may be a need for a barrier film between layers 14 and 30, to prevent intermixing of these two layers (see EXAMPLE below). Thereafter, the second layer 30 is masked and exposed at 32, leaving a second unexposed region 34 which corresponds in thickness and in shape to the cross-sectional level 26 of the three-dimensional structure 22, also illustrated in FIGS. 1 (f) and 2.

It should be noted that the exposure time is selected to be just sufficient to penetrate the second photoresist layer 30, but insufficient to penetrate into the first photoresist layer 14. This is readily accomplished, since many photoresists have higher absorption when they are unexposed as compared to when they are exposed. However, a slight exposure into the first photoresist layer 14 can be tolerated. The photoresist material is absorbing at the exposure wavelength, thereby helping to prevent light from reaching the lower layers, although it is more transparent at the wavelength of the optical device with which it is to be used.

Figure 1F:
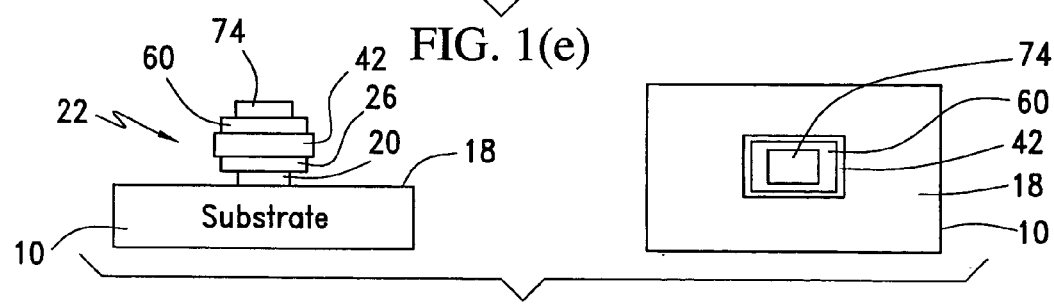
Figure 2:
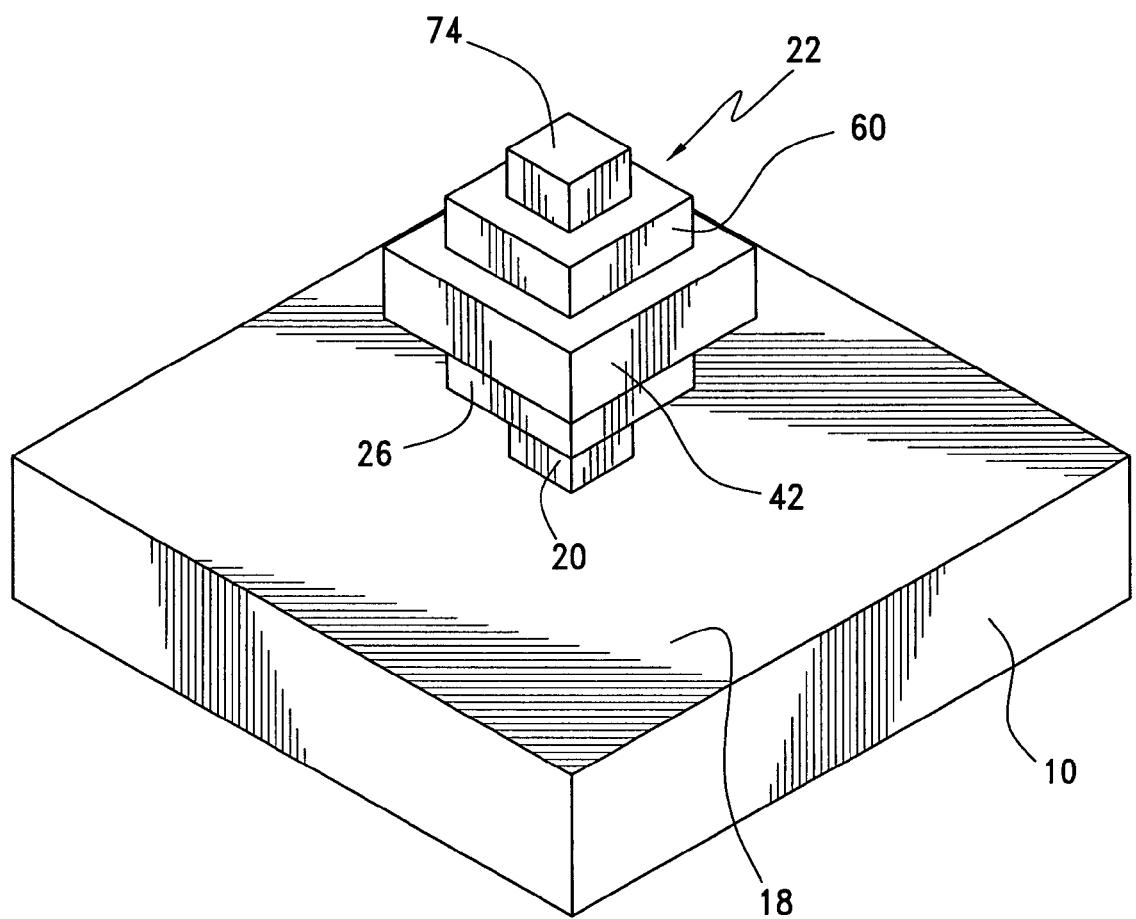
FIG. 2 is a diagrammatic illustration of a monolithic three-dimensional structure fabricated in accordance with the steps of FIG. 1.

After exposure of the second layer 30, and before development of the exposed material, a third layer 40 of a conventional photoresist material is applied to the top surface of second layer 30. Again, a barrier film may be applied, if needed, and the thickness of the third layer is selected to correspond to the desired thickness of the third level 42 of the three-dimensional structure 22, as illustrated in FIG. 1(f) and FIG. 2. The third layer is exposed, as before, in region 44, leaving an unexposed region 46 corresponding to level 42, as illustrated in the cross-sectional view 48 and in the top view 50.

In the illustrated embodiment, a fourth layer 52 is applied to the top surface of layer 40 and is exposed in region 54, leaving an unexposed region 56. Again, the photoresist layer 52 is exposed photolithographically through a suitable mask for a time period which is sufficient to expose layer 52 but not layer 40. The thickness of layer 52, illustrated in the cross-sectional view 58, corresponds to the thickness of level 60, illustrated in FIG. 1(f) and FIG. 2, with its length and width dimensions, illustrated in the top view 62, being of any desired shape.

Finally, in the illustrated embodiment, a fifth layer 64 is applied to the top surface of layer 52 and is exposed at region 66, as illustrated in the cross section 68 and the top view 70. The top layer 64 is masked to leave a selected region 72 unexposed, with this region corresponding to level 74 of the structure 22, as previously described. The length and width of region 72 is of any selected arbitrary shape, as previously discussed. Barrier films may be provided between successive layers, as described above.

As a final step, all five layers 14, 30, 40, 52 and 64 of the photoresist material are developed in a single step, in conventional manner, removing the exposed regions 26, 32, 44, 54, and 66 and leaving the structure 22. Although the various levels of structure 22 are illustrated as being generally rectangular, it will be understood that each level may be of any desired shape or size and may be positioned at any desired location on the substrate.

An alternative process for fabricating the solid three-dimensional structure of FIG. 2 is illustrated is FIG. 3, to which reference is now made. In this process, two different types of photoresistive material are used to enable the structure to be fabricated in successive exposure steps and in just two layers of photoresist material.

In FIG. 3(a), a substrate 90 is provided with a first layer 92 of a negative photoresist material, in which sections that are unexposed are removed through development. After the exposure steps to be described, a second layer 94 of photoresist material is applied on the top surface of layer 92, but this layer is of opposite polarity; i.e., is positive; that is, sections that have been exposed are removed by development.

In the first step, following deposition of layer 92 on substrate 90, a first region 96 of layer 92 is exposed through a suitable mask, using conventional photolithography. As illustrated in the cross-sectional view 100 and in the corresponding top view 102, the unexposed region 96 may be of a selected thickness and shape to correspond to a first level 104 of a three-dimensional structure 106 illustrated in cross section 108 and top view 110 of FIG. 3(f). The region 112 surrounding the exposed area 96 remains unexposed in this negative photoresist layer.

In step 2, illustrated in cross section 114 and top view 116 of FIG. 3(b), the layer 92 is further exposed in conventional manner as by a projection aligner, for a length of time which causes the unexposed material in layer 92 which lies directly below the previously exposed region 96, now to be exposed through the thickness of layer 92, thus causing the exposed region 96 to be transferred through the layer 92 to a depth corresponding to level 104 of the structure 106. During this second exposure, a second level 120 may be exposed, with level 120 being of a different size and shape than the region 96. This second exposed area 120 is at least as large as, and extends to the edges of, region 96 in order to transfer region 96 to the lower level of layer 92. Region 112' is masked during this second exposure to remain unexposed.

After the second exposure has been completed, a photoresist layer 94 is deposited on the top surface 122 of layer 92. This layer 94, as previously discussed, is of an opposite photosensitivity type than layer 92; in this case it is positive. As illustrated in the cross section 130 and the top view 132 of FIG. 3(c), the top layer 94 is exposed in region 134 through a suitable photolithographic mask, leaving region 136 unexposed. The unexposed region 136 corresponds in thickness and in shape (i.e., length and width dimensions) to level 138 of structure 106, the length of exposure of region 134 controlling the thickness of region 136.

Thereafter, as illustrated in cross section at 140 and in top view at 142 in FIG. 3(d), layer 94 is exposed again to extend the original exposure region 134 more deeply into layer 94 and to create a new exposed region 144 which defines a new unexposed region 146 corresponding to level 148 of structure 106. Region 146 lies within the boundaries of region 136, and the exposure is timed to produce the desired thickness of region 144.

The fifth exposure is illustrated in cross section at 150 and in top view at 152 in FIG. 3(e), where the layer 94 is again exposed after masking the region 154, which is to correspond to level 156 in structure 106. This produces a new level 158 of exposed resist and forms the levels 136 and 146 of the layer 94 by further exposure through the previously exposed regions 134 and 144 and by initial exposure of the region 158.

As a final step, both of the resist layers 92 and 94 are developed, removing the unexposed material from layer 92 and the exposed material from layer 94 and producing the resultant structure 106. Again, although the levels 104, 120, 138, 148 and 156 are all illustrated as being rectangular, it will be apparent that any arbitrary shapes may be produced using this process, as long as each successive layer is shaped and positioned to permit the repeated exposure of previously exposed regions.

Figure 4A:
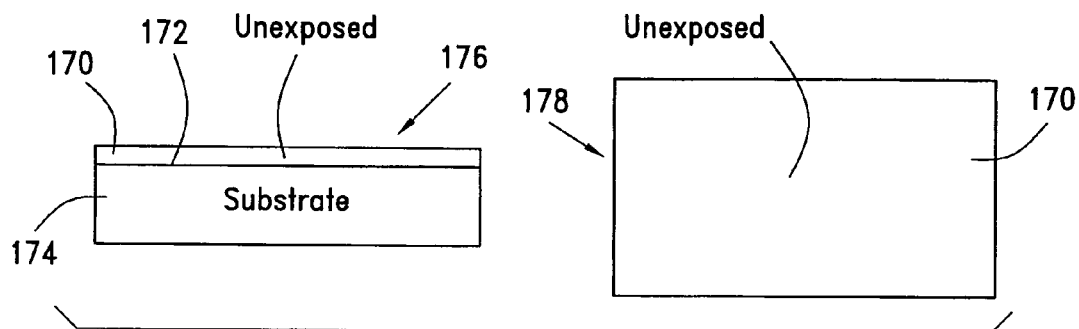
FIGS. 4(*a*) through 4(*d*) illustrate a process for fabricating a grating utilizing the process steps of the present invention, in accordance with a third embodiment of the invention.

FIGS. 4(a)–4(d) illustrate process steps which may be used to fabricate a multilayered structure in which layers are sequentially exposed, and in which all of the layers are developed as a final step, with the development process removing portions of intermediate layers to produce enclosed openings or channels. The illustrated process is shown as producing an optical grating, but it will be apparent that other arbitrary shapes and configurations can be fabricated. In FIG. 4(a), a layer 170 of photosensitive material is applied to the surface 172 of a substrate 174, as illustrated in cross section at 176 and in top view at 178. As before, this layer can be a photoresist layer that has been spun on the substrate surface with the appropriate thickness. This first layer is left unexposed and a second layer 180 of photoresist is deposited on top of the first layer. Thereafter, a projection aligner is used to expose photoresist layer 180 in spaced linear regions 182, as illustrated in cross section at 184 and in top view at 186. These spaced regions 1482 are shown as being linear and closely spaced to form a periodic optical grating or the like but it will be understood that other configurations can be provided. The exposure time is chosen so that the exposed region ends very near the bottom surface of the second layer 180, but does not enter substantially into the bottom layer 170.

Figure 4B:
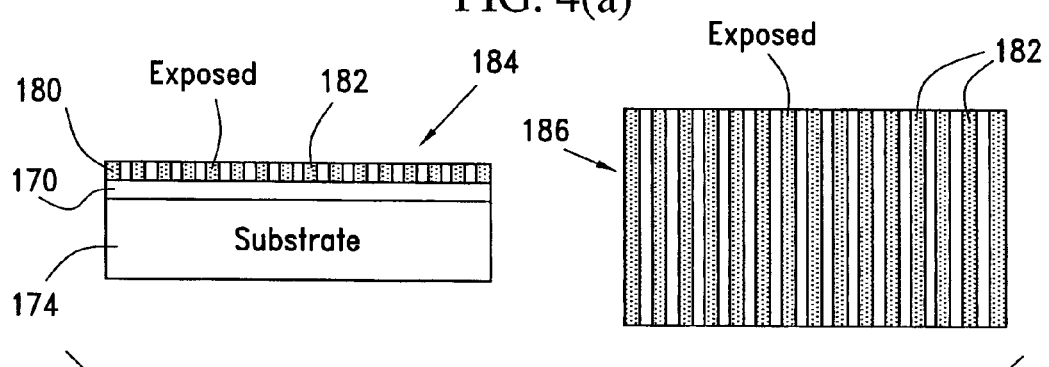
Figure 4C:
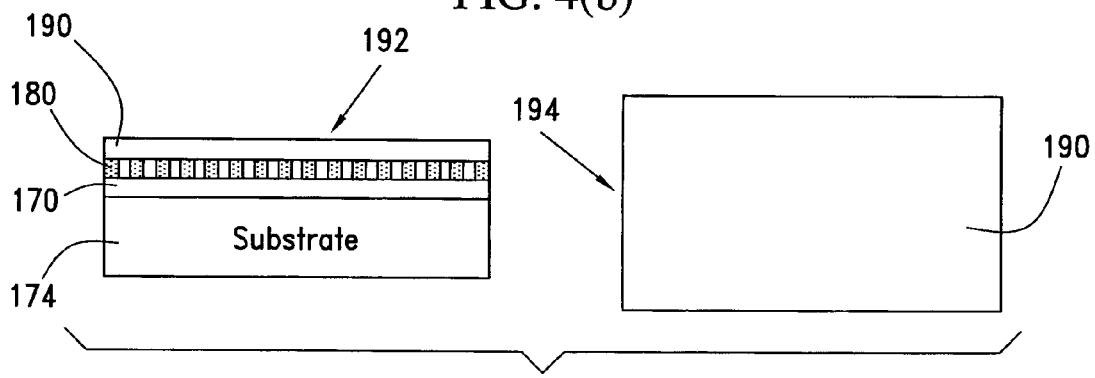
Figure 4D:
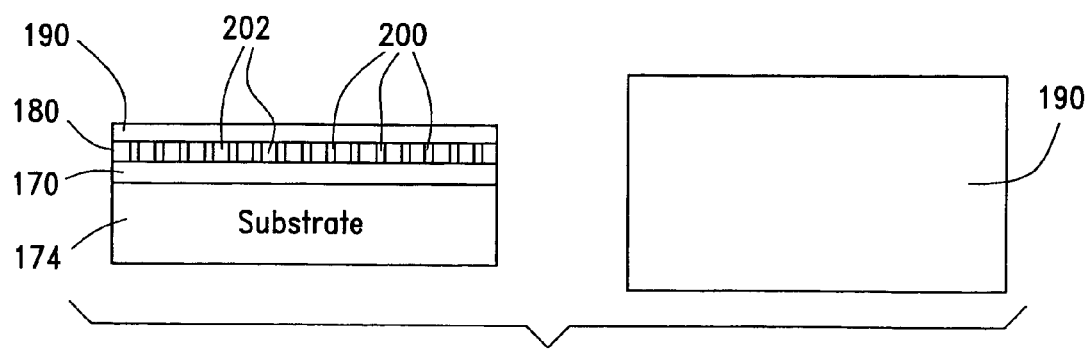

Thereafter, a third layer 190 is deposited on the top surface of the exposed layer 180 before the second layer is developed, as illustrated in cross section at 192 and in top view at 194 in FIG. 4(c), so as to enclose the structure defined on the second layer.

Thereafter, a suitable developer is used to remove any parts of the photoresist materials that have been exposed, such as the enclosed regions 182 of FIG. 4(b). To accomplish this, the developer must travel laterally underneath the third photoresist layer 190, thereby forming channels 200 through the second layer and between unexposed segments of the second layer. The development time is selected to ensure complete removal of exposed photoresist, leaving spaced linear segments 202 of resist material, spaced by channel or cavity regions 200, to thereby form a covered optical grating. Other structures having covered cavities or channels may similarly be fabricated using this process.

The grating described above is a one-dimensional photonic crystal, however, two- and three-dimensional photonic crystals can also be fabricated using the process described hereinabove.

Figure 5:
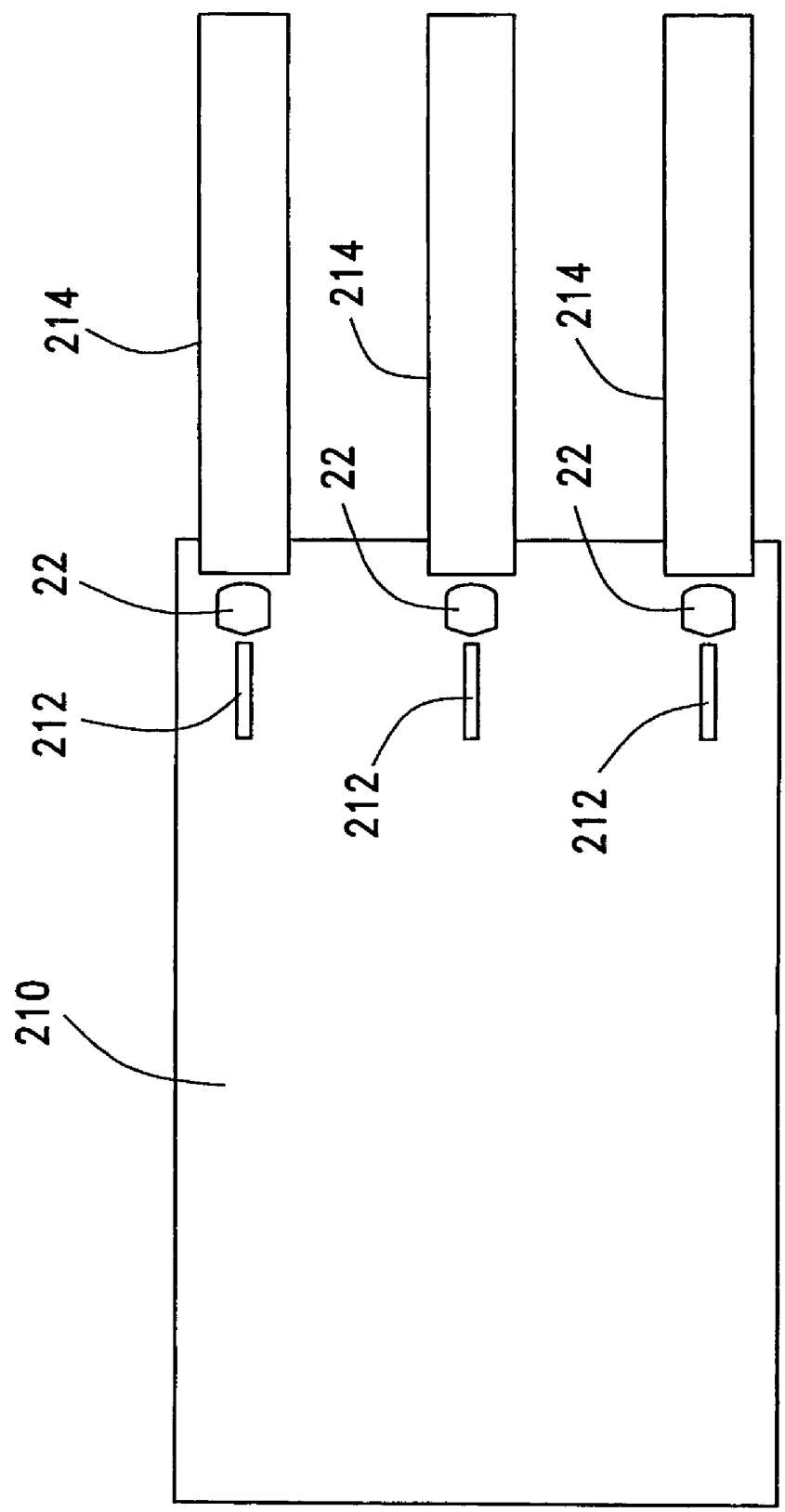
FIG. 5 is a diagrammatic illustration of three-dimensional structures in accordance with the present invention for coupling optical elements to optical fibers.

As illustrated diagrammatically in FIG. 5, the three-dimensional structure such as the structure 22 of FIG. 2 can be fabricated on an optical chip 210 of conventional design and carrying monolithic optical components such as monolithic lasers or waveguides 212 which have been previously fabricated on the chip 210. These optical components 212 may be conventional, and may, for example, be waveguides leading to optical devices such as the ring lasers described above, or may be lasers. The three-dimensional structures 22 may be shaped to match the optical components 212 with corresponding external optical devices such as optical fibers 214. The optical couplers 22 are formed through the processes described above and are positioned very close to the monolithic optical components 212 on the optical chip. The couplers are designed to provide very high efficiency and high positional tolerance for coupling the optical components to the optical elements 214.

Although the above-described three-dimensional structure may preferably be used as an optical coupler in the manner described in FIG. 5, it will be apparent such devices may be shaped to serve as waveguides, and may provide curved as well as linear structures and connections, since the process described hereinabove may be used to fabricate structures of arbitrary shape. Further, it will be understood that the optical couplers not only can be used to connect to external devices in the plane of the chip, but with three-dimensional optical couplers such external optical devices can be positioned within a semispherical volume above the chip. A transparent chip substrate or appropriate holes within the substrate would allow the external optical devices to be positioned within the semispherical volume beneath the chip. It will be further understood that although the above description used photoresist to illustrate the process, any photosensitive material or other materials that lend themselves to lithographic definition can be utilized.

EXAMPLE

Arch Chemicals, Inc. manufactures a photoresist referred to as OIR897-12I on a substrate at 4000 rpm for 30 seconds which results in a layer thickness of 1.2 microns. If layer 30 is also to be formed using the same photoresist, it will be necessary to create a barrier film between layers 14 and 30; otherwise, the spinning on of the second layer of photoresist will dissolve layer 14. Shin-Etsu MicroSi manufactures a chemical referred to as CEM365IS. This chemical has been used to successfully create a barrier film. The process for forming a simple two layer structure with a barrier layer is as follows; with reference to the process of FIG. 1:

(a) Form layer 14 by spinning on OIR897-12I at 4000 rpm for 30 seconds.
   (b) Deposit CEM365IS on top of layer 14.
   (c) Bake sample at 90° C. for 1.5 minutes on a hot-plate (this is the pre-exposure bake, but also serves to create the barrier film).
   (d) Remove excess CEM365IS from above the barrier film by washing in deionized water.
   (e) Expose layer 14 in desired regions.
   (f) Form layer 30 by spinning on OIR897-12I at 4000 rpm for 30 seconds.
   (g) Bake sample at 90° C. for 1.5 minutes on a hot-plate.

(h) Expose layer 30 in desired regions.

(i) Develop layers 14 and 30 in one step.

The CEM 365IS material is photosensitive. It will be apparent that this process for producing a barrier layer between resist layers can be extended for each subsequent layer in the process described hereinabove.

Although the present invention has been described in terms of preferred embodiments, it will be apparent that innovative modifications and variations may be made without departing from the true spirit and scope thereof, as set forth in the following claims:

What is claimed is:

1. A monolithic optical coupler integrally fabricated on an optical chip and having a solid, void-free, multilevel three-dimensional shape comprising:
   a first layer of lithographically definable material on a top surface of said chip, said first layer being individually and at least partially exposed lithographically to define an arbitrary first layer pattern corresponding to the shape of a first level of the multilevel optical coupler;
   multiple additional layers of lithographically definable material, each additional layer being on a top surface of a preceding layer, each additional layer being individually and at least partially exposed lithographically to define vertically aligned arbitrary patterns corresponding to the shapes of respective additional levels of the multilevel optical coupler;
   a barrier between each of said layers of lithographically definable material;
   said layers, upon development, each being of a selected arbitrary shape and being vertically aligned and stacked to form said solid, three-dimensional, multilevel monolithic optical coupler for connecting an optical device on said chip to another optical device either on the chip or external to it.

2. The monolithic optical coupler of claim 1, wherein said lithographically definable material is a positive photoresist material, wherein said exposed pattern in each of said first and additional layers is removed by development and unexposed portions of each of said layers form said optical device.

3. The monolithic optical device coupler of claim 1, wherein said lithographically definable material is a negative photoresist material, whereby said exposed pattern in each of said first and additional layers forms said optical device upon development of said photoresist material.

4. The monolithic optical coupler of claim 1, wherein lithographically definable material of at least one of said first and additional layers is a first photoresist material and the lithographically definable material of at least a second of said first and additional layers is a second photoresist material.

5. The monolithic optical coupler of claim 1, wherein each of said barrier layers is a photosensitive material.

6. The monolithic optical coupler of claim 1, wherein the pattern formed in each of said first and additional lithographically definable layers is of a different shape.

7. The monolithic optical coupler of claim 6, wherein each of said first and additional lithographically definable and barrier layers is optically transparent.

8. A monolithic, multilevel, three-dimensional structure integrally fabricated on a chip, comprising:
   a first layer of lithographically definable material on a top surface of said chip, said first layer being individually and at least partially exposed lithographically to define an arbitrary first layer pattern corresponding to the shape of a first level of the multilevel structure;
   multiple additional layers of lithographically definable material, each additional layer being located on and supported by the top surface of a preceding layer, each additional layer being individually and at least partially exposed lithographically to define a corresponding arbitrary pattern in each additional layer, the patterns in said first and additional layers defining vertically aligned and at least partially overlapping layers, the pattern of each lithographically-defined layer corresponding to the shape of a corresponding level of the multilevel structure;
   a barrier between each of said lithographically-defined layers of lithographically definable material; and
   said lithographically-defined layers, upon development, being of such arbitrary shape and vertical alignment as to form a solid, three-dimensional, multilevel monolithic structure on said chip.

9. The structure of claim 8, wherein said lithographically-defined layers are of arbitrary thickness.

10. The structure of claim 8, wherein the pattern in at least one of said lithographically-defined first and additional layers defines a nonperiodic level in said structure.

11. The structure of claim 8, wherein said structure is an optical coupler for connecting an optical device on said chip to another optical device either on the chip or external to it.

12. The structure of claim 8, wherein said lithographically definable material is a positive photoresist material, wherein said exposed pattern in each of said first and additional levers is removed by development, and wherein unexposed portions of said layers form said levels of said structure.

13. The structure of claim 8, wherein said lithographically definable material is a negative photoresist material, wherein said exposed pattern in each of said first and additional layers forms a corresponding level of said structure upon development of said photoresist material.

14. The structure of claim 8, wherein the lithographically definable material of at least one of said first and additional layers is a first photoresist material and the lithographically definable material of at least a second of said first and additional layers is a second photoresist material.

15. The structure of claim 8, wherein the pattern formed in each of said lithographically-defined layers is of a different shape.

16. The structure of claim 8, wherein each of said lithographically-defined layers is optically transparent.

17. The structure of claim 8, wherein the lithographically definable material of each layer is selected from a group consisting of optically transmissive polymer and positive or negative photoresist materials.

18. The structure of claim 8, wherein the pattern of at least one of said lithographically-defined layers defines a periodic level in said structure.

19. The structure of claim 8, wherein said structure comprises at least three levels, each level having an arbitrary size and shape.

20. The structure of claim 8, wherein said barrier is a photosensitive material.

21. The structure of claim 8, wherein said barrier is a photosensitive material comprising a lithographically definable material and a water soluble material.

* * * * *